US012580351B2

(12) United States Patent
Kuhl

(10) Patent No.: US 12,580,351 B2
(45) Date of Patent: Mar. 17, 2026

(54) CABLE CAP WITH POWER INDICATOR

(71) Applicant: Steve Kuhl, Hopkins, MN (US)

(72) Inventor: Steve Kuhl, Hopkins, MN (US)

( * ) Notice: Subject to any disclaimer, the term of this patent is extended or adjusted under 35 U.S.C. 154(b) by 509 days.

(21) Appl. No.: 17/938,714

(22) Filed: Oct. 7, 2022

(65) Prior Publication Data

US 2023/0246401 A1     Aug. 3, 2023

Related U.S. Application Data

(63) Continuation of application No. 17/658,529, filed on Apr. 8, 2022, now Pat. No. 11,495,923.

(60) Provisional application No. 63/173,210, filed on Apr. 9, 2021.

(51) Int. Cl.

| | |
|---|---|
| *H01R 13/71* | (2006.01) |
| *G01R 21/00* | (2006.01) |
| *G08B 21/18* | (2006.01) |
| *H01R 13/44* | (2006.01) |
| *H01R 13/717* | (2006.01) |
| *H05B 3/56* | (2006.01) |

(52) U.S. Cl.
CPC ......... *H01R 13/7175* (2013.01); *G01R 21/00* (2013.01); *G08B 21/18* (2013.01); *H01R 13/44* (2013.01); *H05B 3/565* (2013.01)

(58) Field of Classification Search
CPC .... H01R 13/7175; H01R 13/44; G01R 21/00; G08B 21/18; H05B 3/565; H05B 2214/02
See application file for complete search history.

(56) References Cited

U.S. PATENT DOCUMENTS

| | | | |
|---|---|---|---|
| 3,305,668 A | 2/1967 | Smith | |
| 4,025,755 A | 5/1977 | Shirley et al. | |
| 4,912,303 A | 3/1990 | Beavers et al. | |
| 5,766,020 A * | 6/1998 | Hughes ................ | H01R 31/065 |
| | | | 439/35 |
| 6,875,954 B2 * | 4/2005 | DeBenedetto ........ | E04D 13/103 |
| | | | 219/544 |
| 7,220,947 B2 | 5/2007 | Cardenas et al. | |
| 7,341,464 B2 * | 3/2008 | Cuellar ................ | H05K 5/0278 |
| | | | 439/135 |
| 7,547,218 B2 * | 6/2009 | Hiew ................. | H01R 13/6395 |
| | | | 439/892 |
| 8,946,600 B1 * | 2/2015 | Dupuis ................ | H05B 1/0252 |
| | | | 219/213 |
| 2004/0094530 A1 | 5/2004 | Debenedetto et al. | |
| 2008/0064271 A1 * | 3/2008 | Hiew ................. | H01R 13/6395 |
| | | | 439/892 |
| 2012/0067868 A1 * | 3/2012 | Casey ................... | E04D 13/103 |
| | | | 219/546 |
| 2012/0132759 A1 * | 5/2012 | Sager ................. | E04D 13/0762 |
| | | | 248/49 |
| 2012/0171887 A1 * | 7/2012 | Sebald ................... | B60L 53/16 |
| | | | 29/858 |

(Continued)

*Primary Examiner* — Truc T Nguyen

(57) ABSTRACT

A cable cap for a heating cable, and a heating cable assembly including a heating cable and a cable cap, in which the cable cap includes a power indicator that illuminates when sufficient power is supplied to the distal end of the heating cable. The indicator gives an installer or a user an indication that the heating cable is functioning properly the entire length of the heating cable. The cable cap may further include a connection feature, such as an aperture, that provides a connection point for a cable pulling device such as a fish tape.

18 Claims, 6 Drawing Sheets

(56)          References Cited

U.S. PATENT DOCUMENTS

2018/0223534 A1      8/2018  Chun
2019/0305465 A1*   10/2019  Sato ................... A61B 1/00137
2020/0370301 A1    11/2020  Casey
2021/0219389 A1*    7/2021  Jenkins .................... H01B 1/02

* cited by examiner

CABLE CAP WITH POWER INDICATOR

RELATED APPLICATIONS

This application is a continuation application of U.S. patent application Ser. No. 17/658,529, filed Apr. 8, 2022, which claims priority to U.S. Provisional Application Ser. No. 63/173,210 filed Apr. 9, 2021, entitled Cable Cap with Power Indicator, hereby incorporated by reference in its entirety.

BACKGROUND OF THE INVENTION

The embodiments of the invention described herein are directed to improved heating cables for applications such as the prevention of ice dams on roofs and the prevention of pipe damage due to freezing. Ice dams occur in colder climates that are subjected to snowfall. Some roofs, especially those found on older homes, have uneven heat loss profiles. Heat from the interior of the home rises to the attic and escapes through the roof. Because heat rises, less heat escapes from the lower portions of the roof and especially over the overhanging eaves found on most homes.

If there has been significant snow accumulation on a roof, heat escaping through the roof melts the snow, causing the meltwater to run down the roof until it hits an area of the roof that has a lower temperature. If this area is cold enough, the water refreezes and accumulates as an ice dam.

Ice dams are problematic as they can cause water to pool behind the dam. The pooled water is often forced up under the shingles and into the structure below causing damage to a variety of materials including insulation, drywall, paint, flooring, windows, doors, cabinetry and more.

Heating cables are sometimes used to address chronic ice dam problems. A heating cable is arranged, usually in a serpentine pattern, near the lower edge of the roof, to create melted pathways through accumulated snow and ice for water to drain. These heating cables have a power connection end and a terminal end. During installation and use, it is difficult to determine whether the power is being delivered to the terminal end. One method used to verify proper cable operation is to supply power to the cable and feel if it is warm along its entire length. This method, however, is impractical or impossible in most applications because the cable may be high on a roof, hidden within a pipe, or otherwise inaccessible. As the cables are often more than 100 feet long, it is not uncommon that sufficient heating power is not delivered to the entire length of the cable due to line losses or damage to the cable along its path, etc. Regardless of cable length, if a cable becomes damaged during or after installation, a proximal portion of the cable may provide adequate heat but a remaining portion distal of the damaged may not receive sufficient power to provide adequate heating, if power is received at all. Moreover, damage to the jacketing on the cable can allow water ingress, rendering some or all of the heating cable useless. It would be desirable to provide a visual indication that power is reaching the distal end of the cable to verify the cable is operating correctly without adding unnecessary burdens or hazards to the property owner or installer.

Installing heating cable often involves pulling cable through tight spaces such as gutter downspouts and inside drainpipes. Installers use long, coiled metal devices called fish tape to pull electrical wiring such as heat cable through inaccessible areas including pipes and gutters. However, given the featureless terminal ends of most existing cables, it can be difficult to effectively connect the fish tape to the cable. Given the stiffness of the cables, significant force is sometimes required to pull the cable through a desired route. It would be advantageous to provide a cable having a terminal end with a feature that can be used to make a connection to a fish tape or similar device that can withstand significant pulling force.

Some attempts have been made to address the problems of providing an indicator of sufficient power to the end of a cable. One example is the RayClic-LE Lighted End Seal Kit for use with some cables produced by nVent Raychem. This solution provides a light attachable to the end of a cable but the design is bulky and thus can only be attached after the cable is installed. If damage occurs while the cable is being run, the damage is not discovered until after the cable routing is complete and the indicator is installed. This indicator also does not address the problem of connecting the heating cable to a fish tape.

SUMMARY OF THE INVENTION

The present invention is directed toward a heating cable with an end cap that includes a power indicator and a connection feature usable to provide a strong connection to a cable pulling mechanism such as a fish tape.

One aspect of the invention provides a cable with a terminal end having a power indicator in the form of an LED that illuminates when an acceptable level of power is sensed. The LED may be housed in a weatherproof enclosure within the cable and having translucent or clear covers on one or both sides such that light from the LED may be visible.

Another aspect of the invention is a cable with an aperture at its terminal end that passes through the cable and can be used to connect the cable to a cable pulling device such as a fish tape.

Still another aspect of the invention is a cable with both a power indicator in the form of an LED that illuminates when an acceptable level of power is sensed, and an aperture at its terminal end that passes through the cable and can be used to connect the cable to a cable pulling device such as a fish tape. The LED may be housed in a weatherproof/ waterproof enclosure within the cable and having windows on one or both sides such that light from the LED may be visible.

Yet another aspect of the invention is an end cap that is attachable to the end of a cable and includes a power indicator that is activated by electricity being carried by the cable.

Still another aspect of the invention is an end cap that is permanently molded to the end of a cable and defines an aperture that passes through the cap and can be used to connect the cable to a cable pulling device such as a fish tape.

Another aspect of the invention is an end cap for a cable with both a power indicator in the form of an LED that illuminates when an acceptable level of power is sensed, and an aperture at its terminal end that passes through the end cap and can be used to connect the cable to a cable pulling device such as a fish tape. The LED may be housed in a weatherproof/waterproof enclosure within the end cap and having windows or translucent covers on one or both sides such that light from the LED may be visible.

In one or more embodiments, the end caps described herein are molded to the end of a cable during production, resulting in the end cap becoming waterproof and permanently attached to the heating cable.

Yet another aspect of the device is that it is low-profile and closely matches the cross-sectional profile of the heating cable. This is desirable to allow running the cable through tight spaces as well as for aesthetics.

Still another aspect of the invention is a method of installing heating cable comprising extending a fish tape through a space through which the heating cable is to be routed; attaching the fish tape to a connection feature of an end cap molded to an end of the heating cable; pulling the heating cable through the space using the fish tape; providing power to the heating cable, thereby activating a power indicator of the end cap that signals electrical continuity is present across an entire length of the heating cable; and verifying proper operation of the heating cable by checking the indicator.

DETAILED DESCRIPTION

Figure 1:
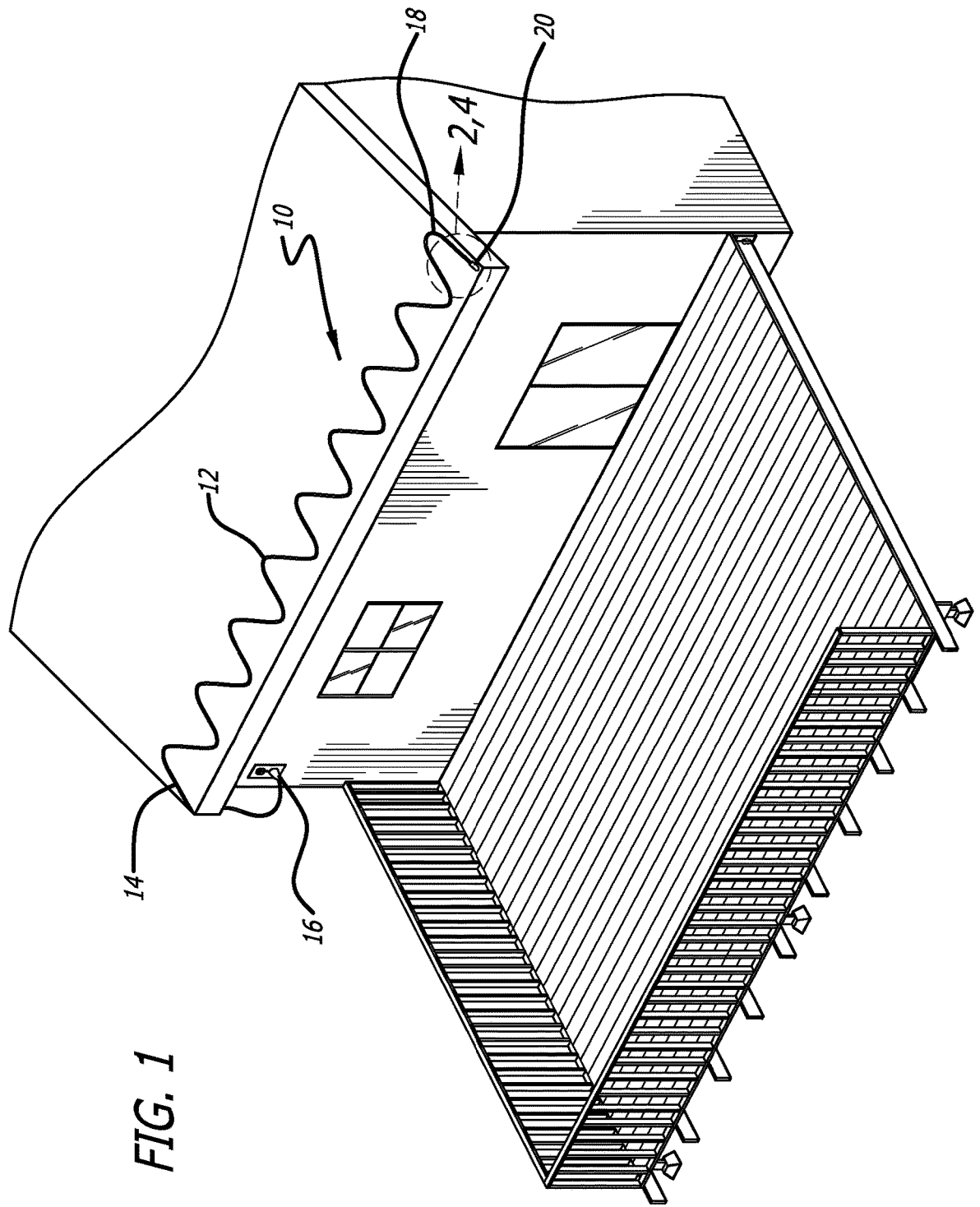
FIG. 1 is a perspective view of an embodiment of the present invention installed on a rooftop.

Specific embodiments of the invention will now be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the embodiments illustrated in the accompanying drawings is not intended to be limiting of the invention. In the drawings, like numbers refer to like elements.

Referring now to the Figures and first to FIG. 1, there is shown an embodiment 10 of a cable of the invention. The cable 10 has an elongate body 12 of selectable length that has a proximal end 14 including a power connection 16, either in the form of a plug, wire ends or other known power connections for connecting the cable 10 to a power supply such as an outlet, a breaker box, or the like. At a distal end 18, opposite the proximal end 14, there is an embodiment of a cable cap 20 of the invention. The features of the various embodiments of the cable cap 20 are shown in FIGS. 2-7.

Figures 2, 3:
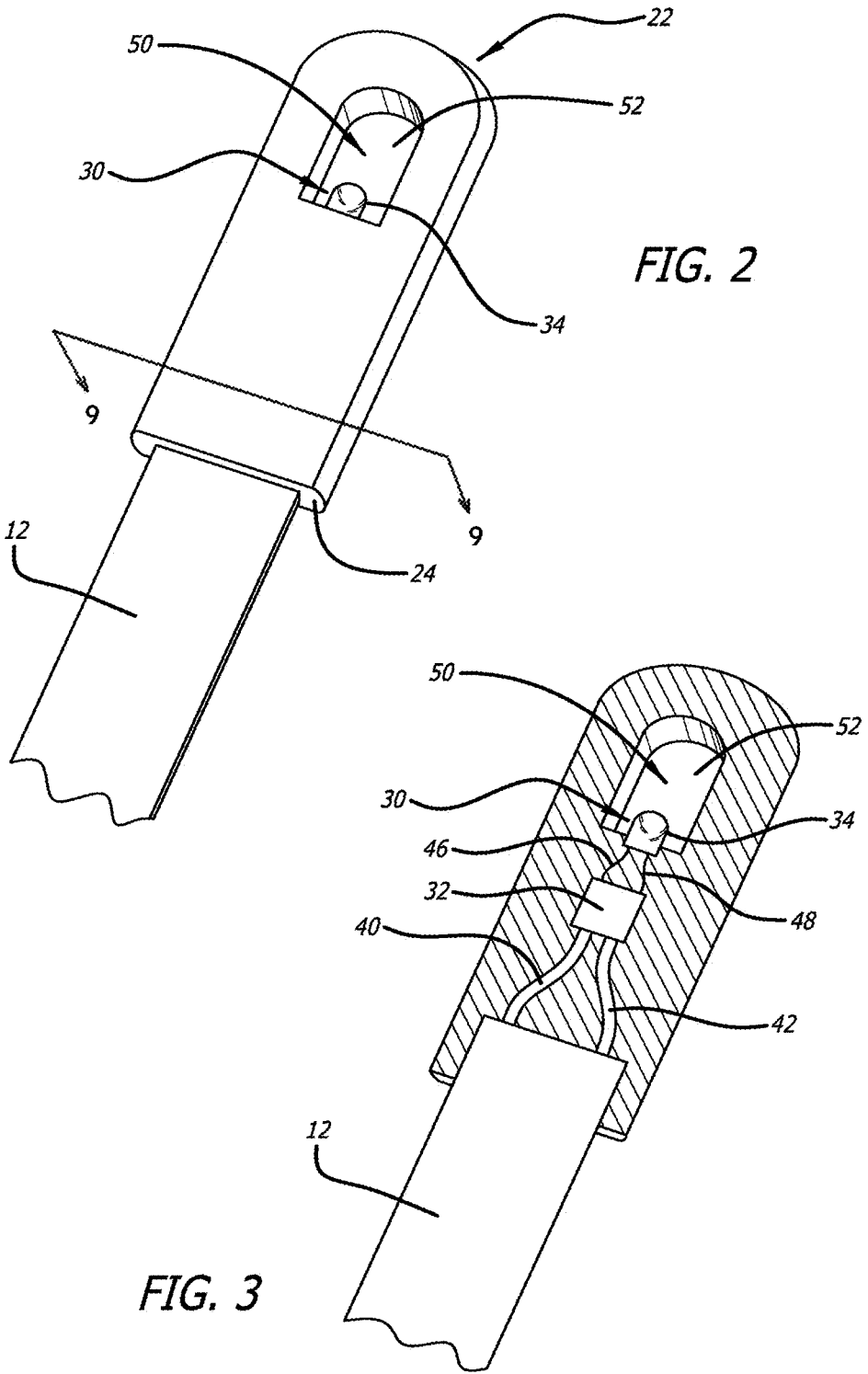
FIG. 2 is a perspective view of an embodiment of a cable cap of the present invention.
FIG. 3 is a perspective cutaway view showing the internal components of the device of FIG. 2.

FIGS. 2 and 3 show a first embodiment 22 of the cable cap 20 of the invention. The first embodiment 22 generally includes a power indicator 30, a connection feature 50, or both. The cable cap embodiment 22 has a cross-section that is shaped and sized to be flush, or only slightly larger than, a cross-section of the cable to which it is attached. FIG. 2 shows the cable cap embodiment 22 connected to a cable body 12 and the difference in dimensions are visible at the point 24 where the cable body 12 enters the cable cap embodiment 22. The cable cap embodiment 22 envelopes the cable body 12 and may have a relatively uniform thickness.

The power indicator 30 may be embodied as a small light source such as a bulb or a light emitting diode (LED). As is known in the art, a resistor 32 of appropriate size may be used, if necessary, between the power supply to the heating cable and the LED to reduce the voltage to a desired level. The resistor may alternatively be a component of the LED or bulb itself, or be omitted altogether depending on the characteristics of the other components in the circuit, without departing from the spirit of the invention.

The power indicator 30 of FIGS. 2 and 3 extends longitudinally into an aperture 52 that forms the connection feature 50. The power indicator 30 is an LED shrouded in a protective cap 34 that prevents damage to the LED from weather or during the use of the connection feature 50. The LED is preferably thinner than the thickness of the cable cap such that no portion of the LED extends perpendicularly further than an outside surface of the cable cap and is thus protected. FIG. 3 is a cutaway view that shows the resistor 32 and two wires 40 and 42 of the cable body 12 that supply power to the resistor 32. Also shown are two leads 46 and 48 that connect the resistor to the LED 30.

Figures 4, 5:
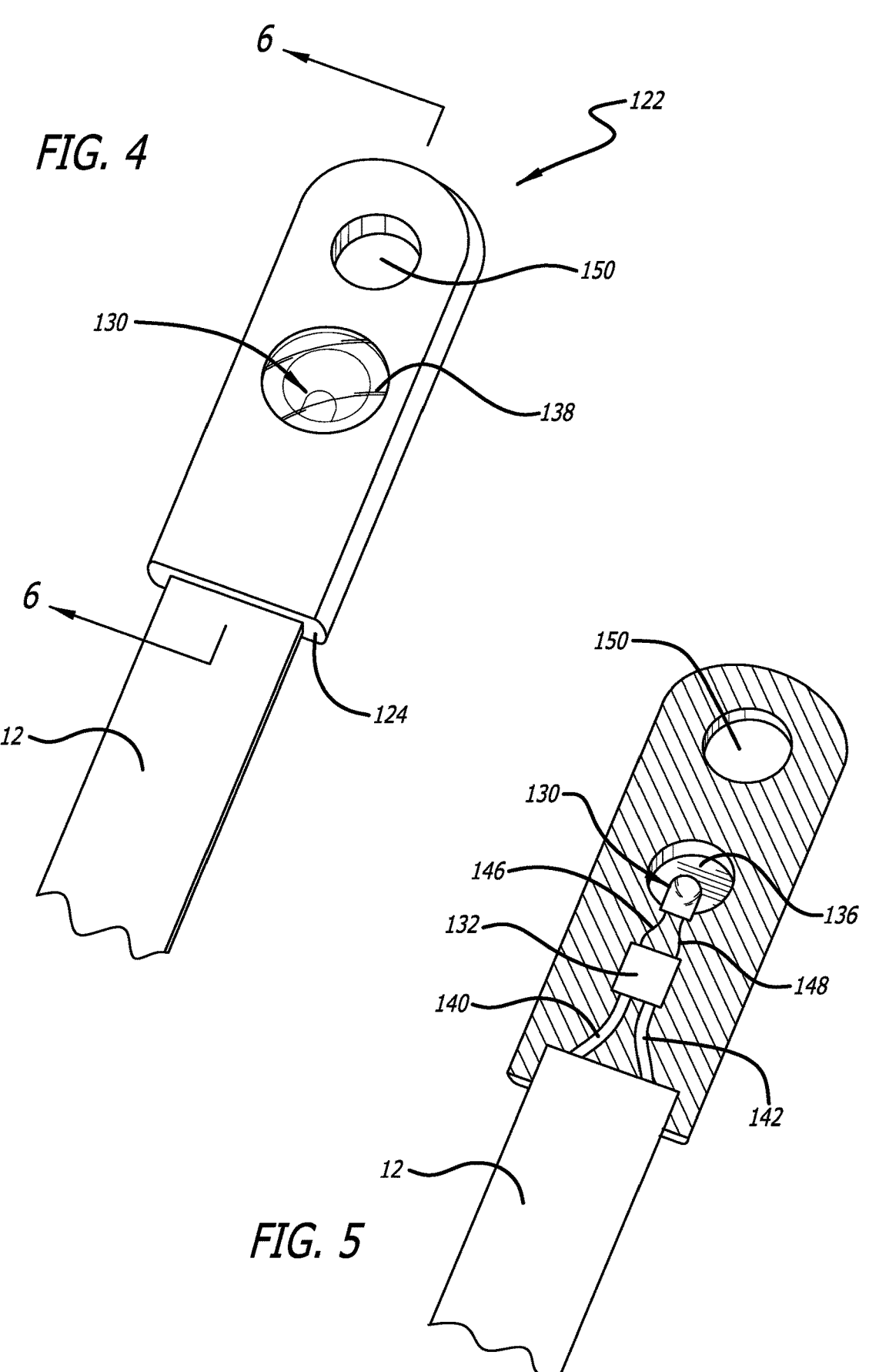
FIG. 4 is a perspective view of an embodiment of a cable cap of the present invention.
FIG. 5. is a perspective cutaway view showing the internal components of the device of FIG. 4.
Figures 6, 7:
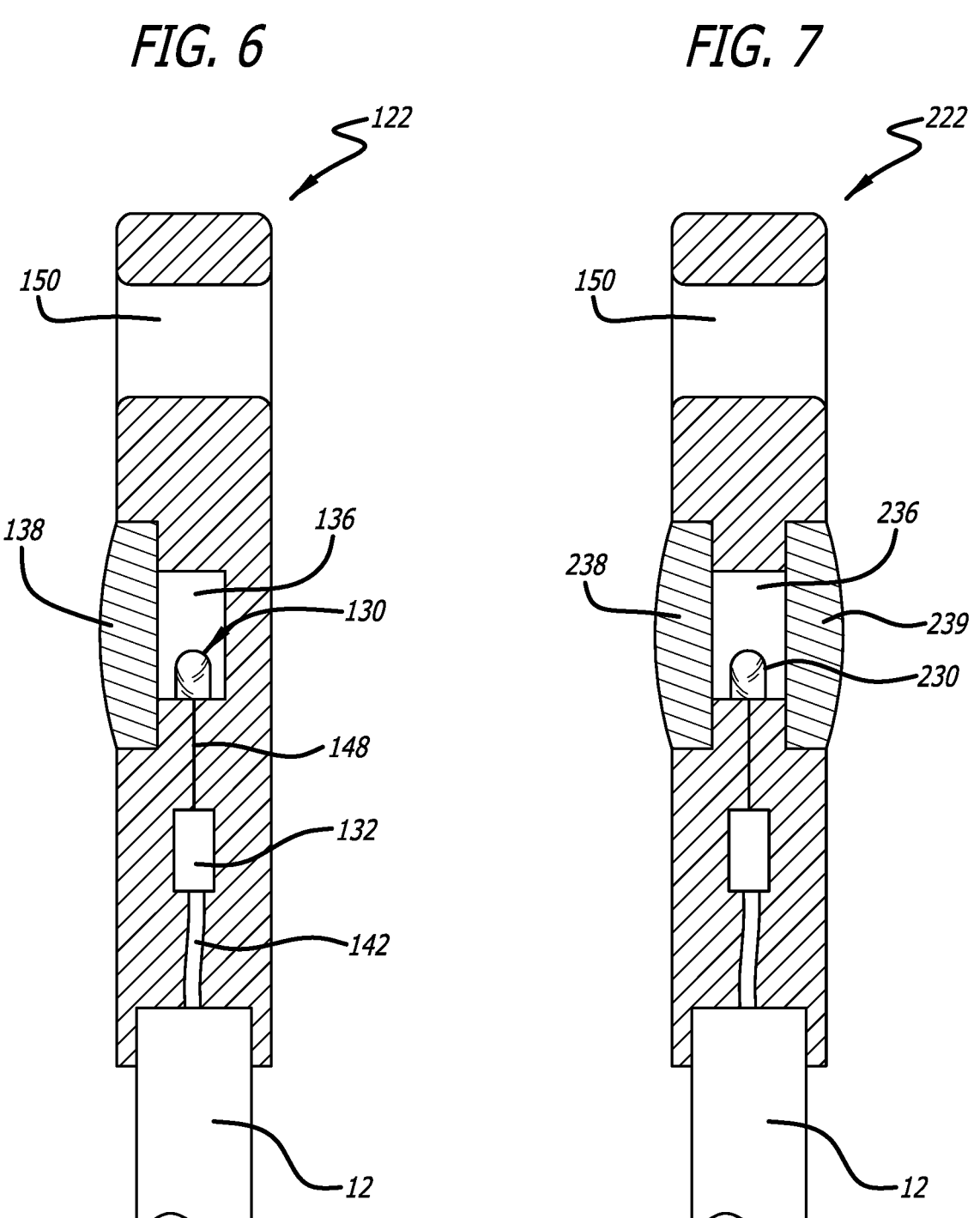
FIG. 6 is a section view taken along section lines 6-6 of FIG. 4.
FIG. 7 is a side cutaway view of an embodiment of the cable cap of the present invention; and, FIG. 8 is a perspective view of an embodiment of a cable of the invention being pulled through a pipe.

FIGS. 4-6 show a second embodiment 122 of the cable cap 20 of the invention. The second embodiment 122 generally includes a power indicator 130, a connection feature 150, or both. The cable cap embodiment 122 has a cross-section that is preferably shaped and sized to be flush, or only slightly larger than, a cross-section of the cable to which it is attached. FIG. 4 shows the cable cap embodiment 122 connected to a cable body 12 and the difference in dimensions are visible at the point 124 where the cable body 12 enters the cable cap embodiment 122. The cable cap embodiment 122 envelopes the cable body 12 and may have a relatively uniform thickness.

The power indicator 130 may be embodied as a small light source such as a bulb or a light emitting diode (LED). As is known in the art, a resistor 132 of appropriate size may be used, if necessary, between the power supply to the heating cable and the LED to reduce the voltage to a desired level. The resistor may alternatively be a component of the LED or bulb itself without departing from the spirit of the invention.

The power indicator 130 of FIGS. 4-6 extends into a space 136 that extends part way through the cable cap embodiment 122. The space 136 is covered on one side by a clear, translucent or semitransparent cover 138 that allows light from the LED to be seen. Alternatively, the space 136 may be completely filled by a clear, semitransparent or translucent material, such as during the molding process.

FIG. 5 is a cutaway view that shows the resistor 132 and two wires 140 and 142 of the cable body 12 that supply power to the resistor 32. Also shown are two leads 146 and 148 that connect the resistor to the LED 130.

In at least one embodiment, the heating cable 12 is self-regulating cable that increases or decreases the amount of power being drawn from the power source to meet the demands of the weather conditions and the varying temperatures across the heating cable. This is accomplished using a conductive core that houses the two wire conductors 40 and 42 or 140 and 142. Unlike most circuits, where a hot and a neutral wire are connected across one or more loads, either in series or in parallel, the conductors are not insulated and the material separating the conductors becomes the load. As the outside temperature decreases, the material shrinks and the resistance across the conductors is reduced, allowing more current to flow through the material. As the material heats up due to the increased current, the material expands again, increasing the resistance and regulating the amount of heat given off by the heating cable. As the ability of the material to expand and shrink is limited and known, LEDs can be selected that operate in the corresponding current parameters, thus obviating the need for more complex circuitry. The LEDs may further be selected to require a minimum amount of current power available at the end of the cable, indicative of proper operation of the heating cable, regardless of the temperature outside.

The connection feature 150 of cable cap embodiment 122 is an aperture that passes through the cable cap 122. The connection feature is spaced distally from the power indicator 130 to ensure that pulling forces do not damage the power indicator 130.

FIG. 6 is a section view taken along section lines 6-6 of FIG. 4. FIG. 6 illustrates the depth of the space 136 and the aperture that forms the connection feature 150. Though not shown, the aperture 150 may be reinforced, such as by lining the aperture with a steel rim or embedding a steel rim in the molded body of the cable cap 122.

FIG. 7 is an embodiment 222 of a cable cap that is identical to embodiment 122 except that the space 236 that houses the power indicator 230 extends all the way through the cable cap and has windows 238 and 239 on either side of the power indicator 230 such that light emitted from the power indicator 230 can be seen from either side of the cable cap 222. As an alternative to windows, the space 236 may be filled with a semitransparent, translucent or clear material, such as during the molding process, in order to further protect the bulb 230 and strengthen the device 222.

Figure 8:
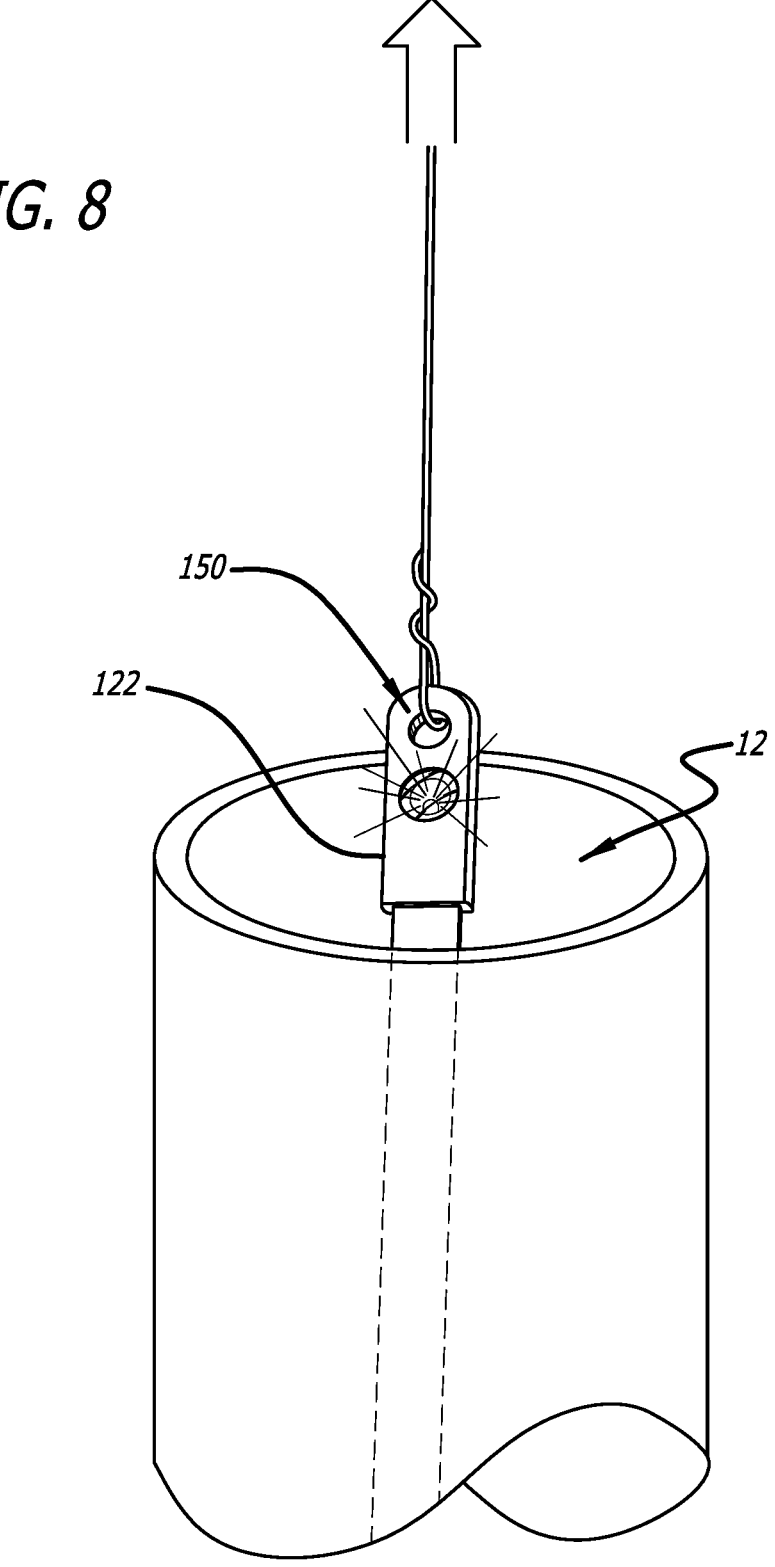

FIG. 8 shows an embodiment of a cable 12 with an end cap 122 being pulled through a pipe using a fish tape. This is provided to show just one non-limiting example of the use of the connection feature 150. This example usage applies to all embodiments of the device described herein.

Figure 9:
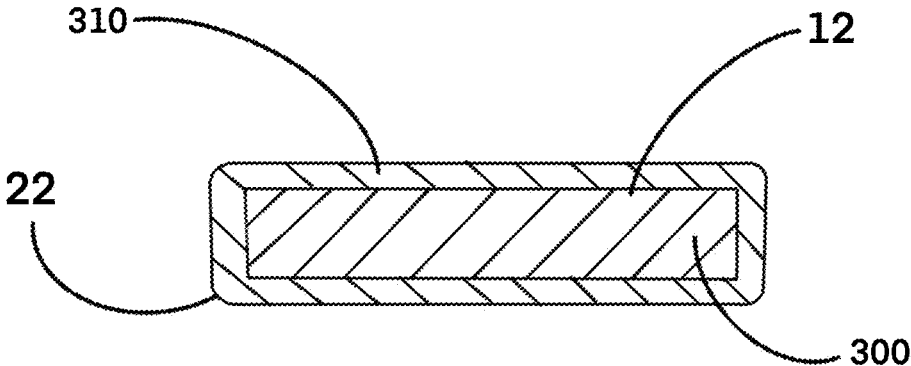
FIG. 9 is a section view taken along section lines 9-9 of FIG. 2

(renumbered to reflect the addition of paragraph [0026]) FIG. 9 shows an example cross section, taken along section lines 9-9 of FIG. 2, that compares the cross-sectional area 300 of the cable 12 with the cross section area 310 of the cable cap 22.

Although the invention has been described in terms of particular embodiments and applications, one of ordinary skill in the art, in light of this teaching, can generate additional embodiments and modifications without departing from the spirit of or exceeding the scope of the claimed invention. Accordingly, it is to be understood that the drawings and descriptions herein are proffered by way of example to facilitate comprehension of the invention and should not be construed to limit the scope thereof.

What is claimed is:

1. A cable cap for a heating cable comprising: a power indicator, connectable to a distal end of a heating cable, that illuminates when the heating cable has been connected to a power source at a proximal end of the heating cable, the cable cap having a cross-section that is shaped and sized to substantially match a cross-section of the heating cable to which it is to be attached such that the cable cap does not present a hinderance when the heating cable, with the cable cap connected, is routed through obstacles during installation.

2. The power indicator cap of claim 1 wherein the power indicator comprises a light emitting diode.

3. The power indicator cap of claim 1 wherein the power indicator extends longitudinally into an aperture formed in the cable cap.

4. The power indicator cap of claim 1 wherein the cross-section is shaped and sized to be flush with the cross-section of the heating cable to which it is to be attached.

5. The power indicator cap of claim 1 wherein the cross-section is shaped and sized to be slightly larger than the cross-section of the heating cable.

6. The power indicator cap of claim 3 wherein the aperture extends through the cable cap.

7. The power indicator cap of claim 5 wherein the aperture is covered by a window.

8. The power indicator cap of claim 6 wherein the aperture is covered by two windows on opposite sides of the cable cap.

9. A heating cable assembly comprising: a length of heating cable between a proximal end and a distal end, the proximal end being connectable to a power source; a cable cap covering the distal end and having a cross-sectional shape that substantially matches a cross-sectional shape of the heating cable, and including: a power indicator that illuminates when the proximal end of the heating cable is connected to a power source.

10. The heating cable assembly of claim 9 wherein the power indicator comprises a light emitting diode.

11. The heating cable assembly of claim 9 wherein the power indicator extends longitudinally into an aperture formed in the cable cap.

12. The heating cable assembly of claim 11 wherein the aperture extends partway through the cable cap.

13. The heating cable assembly of claim 11 wherein the aperture extends through the cable cap.

14. The heating cable assembly of claim 12 wherein the aperture is covered by a window.

15. The heating cable assembly of claim 13 wherein the aperture is covered by two windows on opposite sides of the cable cap.

16. The heating cable assembly of claim 9 wherein the cable cap is molded to the distal end of the heating cable.

17. A method of preventing ice accumulation on a roof comprising: routing a heating cable, having an end cap at a distal end thereof, in a pattern on a roof; providing power to the heating cable at a proximal end thereof, thereby activating a power indicator of the end cap if an entire length of the heating cable is operating properly; and, verifying whether the heating cable is fully operational by checking the indicator; wherein the heating cable is a self-regulating heating cable that increases or decreases an amount of power being drawn from a power source to meet the demands of weather conditions and temperature variations encountered by the heating cable.

18. The method of claim 17 wherein the power indicator comprises a light emitting diode.

\* \* \* \* \*